United States Patent [19]

Lowe

[11] 3,768,033

[45] Oct. 23, 1973

[54] ELECTRONIC DEAD BAND DEVICE

[75] Inventor: Edward A. Lowe, Ipswich, Mass.

[73] Assignee: General Electric Company, Schenectady, N.Y.

[22] Filed: Mar. 17, 1972

[21] Appl. No.: 235,619

[52] U.S. Cl. ................ 330/84, 330/110, 330/124 R
[51] Int. Cl. ................................................ H03f 3/68
[58] Field of Search ...................... 330/1 A, 84, 110, 330/124 R; 318/307, 624, 677

[56] References Cited

UNITED STATES PATENTS 3,187,325 6/1965 Waldhauer ...................... 330/110 X

*Primary Examiner*—Roy Lake
*Assistant Examiner*—James B. Mullins
*Attorney*—William C. Crutcher et al.

[57] ABSTRACT

An electronic dead band device, which provides for zero output in a dead band region including a negative voltage polarity sensitive circuit, and a positive voltage polarity sensitive circuit, each biased to a dead band level of opposite polarities by biasing circuitry.

9 Claims, 2 Drawing Figures

ELECTRONIC DEAD BAND DEVICE

BACKGROUND OF THE INVENTION

The present invention relates to an electronic dead band device which will be specially applicable to small signal applications in that it provides for zero output in a dead band region.

In small signal applications, such as those resulting from the control of synchronous motors, a suitable dead band device should inhibit any input signal within the undesirable (dead band) voltage region expected to be caused by the synchronous motors. A suitable dead band device should also produce a dead band region which can be adjusted in the millivolt range from zero volts DC to any desired positive and negative voltage level. However, any input signal which has an amplitude outside the dead band region should pass through the device and be attenuated only by the DC voltage level equal to the dead band voltage.

The technique of using diodes to cause a dead band is well known in the art as evidenced by U.S. Pat. No. 3,450,973, issued to R. Tobey.

The Tobey patent is not suitable for small signal applications in that the output of a circuit built according to Tobey, as understood, does not produce an output of zero volts in the dead band region which would be required for small signal dead band application. The Tobey patent and other prior art approaches to provide a dead band control for small signal applications generally have created problems in that they can not be adjusted in the millivolt range, are not linear, and are also very temperature sensitive.

The foregoing problems have been substantially eliminated by providing, in a preferred embodiment of my invention, an electronic device comprising two amplitude and voltage polarity sensitive circuits, each circuit comprising an operational amplifier, silicon diode and biasing resistors. Biasing circuitry, comprising an adjustable voltage bias source and a polarity reversal circuit to provide a bias of opposite polarity to an input of each operational amplifier is included. An input signal and bias of opposite polarity are applied to the input of each operational amplifier. If the amplitude of the bias is greater than the amplitude of the input signal, the silicon diodes of each operational amplifier will be reverse biased and will not conduct, and the circuit output will be zero volts. When the input signal amplitude is greater than the amplitude of the bias, the silicon diode of the applicable operational amplifier will conduct; and the amplitude of the circuit output will be equal to the input signal less the bias. Use of two opposite polarity circuits permits the control of positive and negative voltage levels.

SUMMARY OF THE INVENTION

It is therefore an object of this invention to provide a new and improved dead band device to eliminate a range of undesirable input signals in small signal applications.

It is another object of this invention to provide a dead band device which is continuously adjustable in the dead band region from a millivolt level down to zero volts.

It is another object of this invention to provide a dead band device with an output signal rate of change substantially identical with the input signal rate of change outside the dead band region.

It is a further object of this invention to provide a new and improved dead band device which will not be affected substantially by temperature variations.

Briefly stated, and according to one aspect of the invention, the foregoing objects are achieved by producing a new and improved dead band device comprising two amplitude and voltage polarity sensitive circuits, each biased to a dead band level of opposite polarity through a suitable adjustable bias source and a polarity reversal circuit. Each amplifier includes a silicon diode connected to its output. Each amplifier provides for conduction of its associated silicon diode when the input signal is of opposite polarity and exceeds the bias produced by the biasing circuitry.

BRIEF DESCRIPTION OF THE DRAWINGS

The invention, both as to its organization and principle of operation together with further objects and advantages thereof may better be understood by reference to the following detailed description of an embodiment of the invention when taken in conjunction with the accompanying drawings in which.

DESCRIPTION OF THE PREFERRED EMBODIMENT

Figure 1:
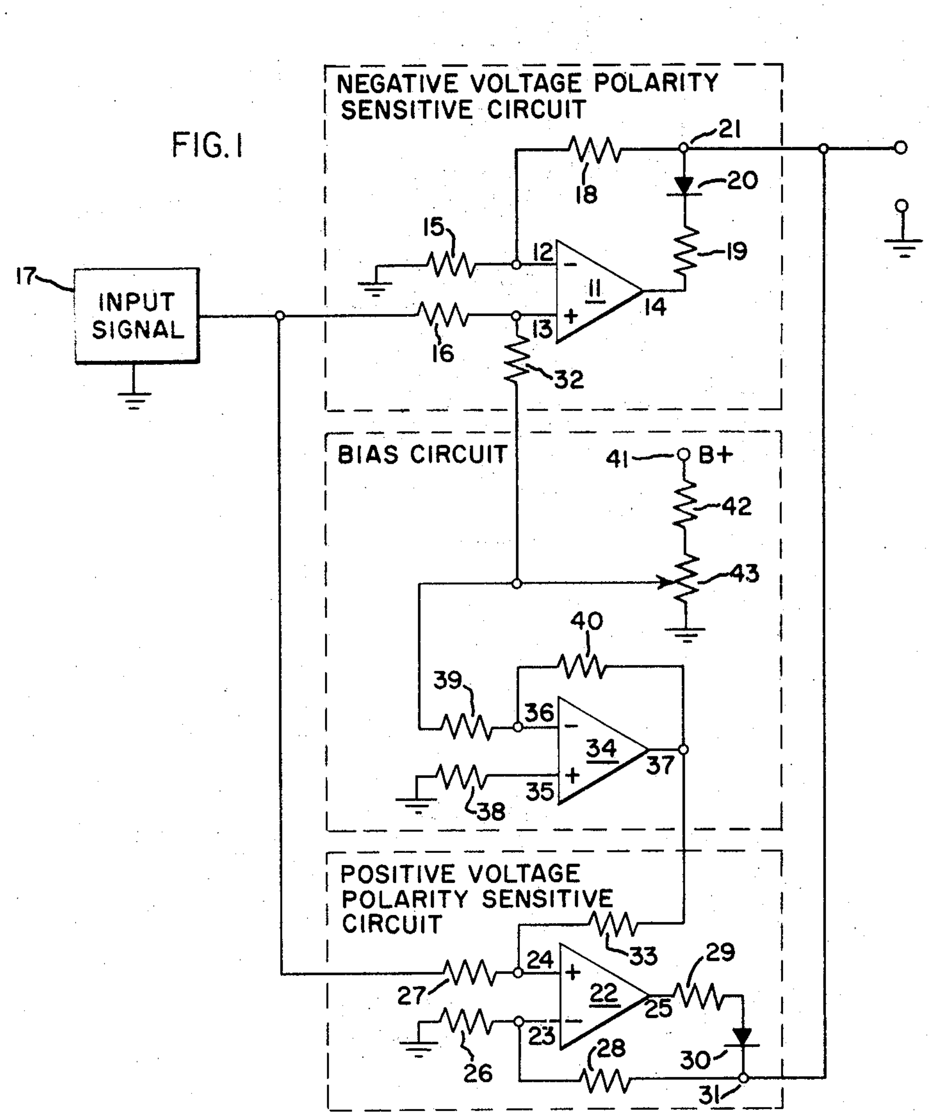
FIG. 1 is a circuit diagram illustrating the basic concepts of a dead band amplifier in accordance with this invention.

Referring now to FIG. 1 of the drawings, there is illustrated a negative voltage polarity sensitive circuit including a first linear operational amplifier 11 having a negative input terminal 12 connected to ground through ground resistor 15, and a positive input terminal 13 connected through an isolation resistor 16 through which an input signal is applied at terminal 17 and further connected to biasing circuitry through a coupling resistor 32. Amplifier 11 is provided with an output 14 which is connected to a series circuit comprising a first output resistor 19 which output resistor 19 is serially connected to the cathode of a unidirectional means such as a first silicon diode 20. The anode of the series connected first diode 20 is connected to a first output terminal 21 for the dead band device and to the negative input terminal 12 of amplifier 11 through a feedback resistor 18. Feedback resistor 18, first diode 20 and the output resistor 19 connected between the negative input terminal 12 and the output 14 form a first feedback loop for amplifier 11.

A positive voltage polarity sensitive circuit is included in this invention comprising a second linear operational amplifier 22 having a negative input terminal 23 connected to ground through ground resistor 26, and a positive input terminal 24 connected through an isolation resistor 27 through which an input signal is applied at terminal 17 and further connected to biasing circuitry through a coupling resistor 33. Amplifier 22 is provided with an output 25 which is connected to a series circuit comprising a second output resistor 29 which output resistor 29 is serially connected to the anode of unidirectional means such as a second silicon diode 30. The cathode of series connected second diode 30 is connected to a second output terminal 31 for the dead band device and to the negative input terminal 23 of amplifier 22 through a feedback resistor 28. Feedback resistor 28, second diode 30 and the output resistor 29 connected between the negative input terminal 23 and the output 25 form a second feedback loop for amplifier 22. The first output terminal 21 of the negative voltage polarity sensitive circuit and the second output terminal 31 of the positive voltage polarity sensitive circuit are connected together to form a circuit output for the dead band device.

The positive input terminal 13 of the negative voltage polarity sensitive circuit and the positive input terminal 24 of the positive voltage polarity sensitive circuit are connected to a biasing circuit through coupling resistors 32 and 33 respectively. Coupling resistor 32 is connected to a potentiometer or adjustable resistor 43 and to an input resistor 39 which is serially connected to the negative input terminal 36 of amplifier 34. Coupling resistor 33 of the positive voltage polarity sensitive circuit is connected to output 37 of amplifier 34. Amplifier 34 having a positive input terminal 35 connected to ground through ground resistor 38 is provided with a feedback loop comprising a feedback resistor 40 connected between output 37 and negative input terminal 36.

Adjustable resistor 43, grounded at one end, is connected at the other end to a positive bias voltage source 41 through a fixed resistor 42, to act as a dead band adjustment control by providing the adjustability to the voltage from source 41.

Figure 2:
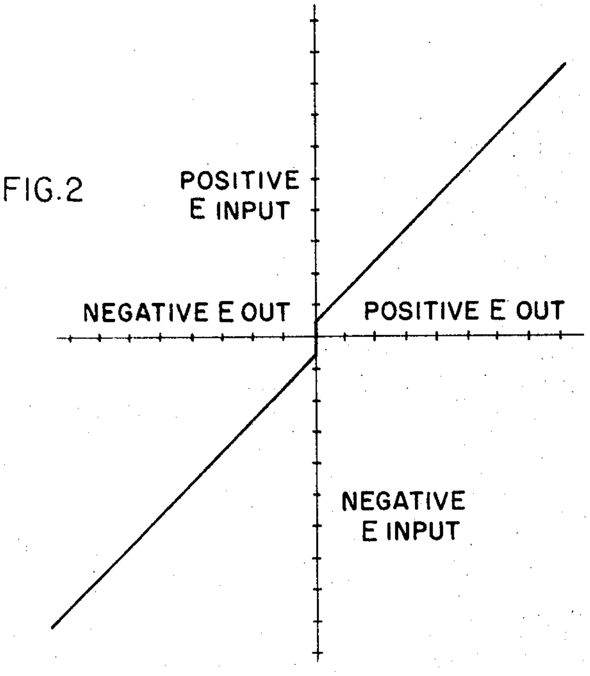
FIG. 2 is a graphical representation of the operating characteristics of a dead band amplifier in accordance with this invention.

In operation, the dead band limits of an electronic device made in accordance with this invention will be determined by the absolute value of the bias, assuming the same gain in amplifier 11 and 22 and a unity gain of amplifier 34. This is shown in the graphical illustration of FIG. 2. FIG. 2 further shows that complete cutoff will occur until the input signal at terminal 17 becomes greater than and of opposite polarity to the bias at positive input terminal 13 and positive input terminal 24. FIG. 2 further shows that the output signal in the first quadrant has no polarity change, that is a positive input will result in a positive output.

Amplifier 11 in the negative polarity sensitive circuit is an integrated circuit operational amplifier which produces no polarity reversal between the positive input terminal 13 and the output 14. Amplifier 11 is also normally a unity gain amplifier and produces an output signal at output 14 with a rate of change substantially identical to the input signal rate of change at positive input terminal 13.

In operation, the adjustable resistor 43 controls the amount of positive bias to be applied to the positive input terminal 13 of amplifier 11. The input signal at terminal 17 and the bias voltage are summed at the positive input terminal 13 of amplifier 11. If the resulting summation is positive, the first diode 20 will be reverse biased and will not conduct and the voltage at the output terminal 21 will therefore be zero volts. When the input signal amplitude is negative, and absolutely greater than the bias, the resulting summation will be negative and first diode 20 will conduct, and the circuit output amplitude at output terminal 21 will be equal to the input signal at terminal 17 less the bias at the positive input terminal 13. The voltage drop across the first diode 20 during conduction will not be felt at the output terminal 21 in that as the forward bias voltage changes during conduction, usually at a rate of 3 millivolts per degree Centigrade temperature change, the characteristics of amplifier 11 with its associated feedback resistor 18 will compensate for any voltage change incurred by the first diode 20 due to temperature. In small signal applications, as are intended to be utilized with the preferred embodiment of this invention, the change of approximately 3 millivolts per degree Centigrade temperature change is unacceptable.

The same amount of positive bias voltage from bias source 41 which positively biases amplifier 11 at positive input terminal 13 is the positive input voltage to amplifier 34 at negative input terminal 36. Amplifier 34, which is normally a unity gain amplifier to provide equal positive and negative dead band limits is of the integrated circuit operational amplifier type which will realize a polarity reversal between its negative input terminal 36 and its output 37. This will cause a voltage at output 37, to bias amplifier 22 to the opposite polarity of the bias which occurs at positive input terminal 13 of amplifier 11. Thus, in FIG. 1, a negative bias will be applied at the positive input terminal 24 of amplifier 22.

Amplifier 22 in the positive voltage polarity sensitive circuit is also an integrated circuit operational amplifier which produces no polarity reversal between the positive input terminal 24 and the output 25. Amplifier 22 is also normally a unity gain amplifier and produces an output signal at output 25 with a rate of change substantially identical to the input signal rate of change at positive input terminal 24.

In operation, the input signal at terminal 17 and the resulting negative voltage bias from the output 37 of amplifier 34 are summed at the positive input terminal 24 of amplifier 22. If the resulting summation is negative, the diode 30 will be reverse biased and will not conduct and the voltage at the output terminal 31 will therefore be zero volts. When the input signal amplitude is positive and absolutely greater than the bias, the diode 30 will conduct, and the circuit output amplitude will be equal to the input signal at terminal 17 less the bias at the positive input terminal 24. The voltage drop across the second diode 30 during conduction will not be felt at output terminal 31 in that the characteristic of amplifier 22 with its associated feedback resistor 28 will compensate for any voltage change incurred by the second diode 30 due to a temperature change as discussed previously.

It has been shown that by providing a negative and positive voltage polarity sensitive circuit each including a linear amplifier which is biased to a dead band level of opposite polarity by biasing circuitry, a reliable dead band device with an adjustability in the millivolt range can be realized. Furthermore, the practice of this invention achieves a dead band device with a linear output which is not substantially affected by voltage changes due to temperature variations.

While an embodiment and application of this invention has been shown and described, it will be apparent to those skilled in the art that many more modifications are possible without departing from the inventive concepts herein described. The invention, therefore, is not to be restricted except as is necessary by the prior art and by the spirit of the appended claims.

What is claimed as new and desired to be secured by Letters Patent of the United States is:

1. An electronic dead band device for providing zero output when an input signal is in a dead band region comprising:

a first linear amplifier having a first feedback loop;

a second linear amplifier having a second feedback loop;

a first input terminal means connected to an input of said first linear amplifier for receiving the input signal;

a second input terminal means connected to an input of said second linear amplifier for receiving the input signal;

a first unidirectional means, for providing unidirectional conduction, having a first end and a second end, said first end of said first unidirectional means being connected in series in said first feedback loop to allow conduction in said first unidirectional means when the output of said first linear amplifier is of a first polarity;

a second unidirectional means for providing unidirectional conduction having a first end and a second end, said first end of said second undirectional means connected in series in said second feedback loop to allow conduction in said second unidirectional means when the output of said second linear amplifier is of a second polarity, said second polarity being opposite of said first polarity;

means for establishing limits of the dead band voltage region within which limits the input signal is rendered ineffective to thereby cause only the zero output, said means including a biasing circuit connected to said first and second input terminal means, said biasing circuit comprising means for receiving a bias potential and for supplying to said first linear amplifier a predetermined bias of the second polarity and to said second linear amplifier a predetermined bias of the first polarity;

a first output terminal means connected in the first feedback loop to the second end of said first unidirectional means; and a second output terminal means connected in the second feedback loop to the second end of said second unidirectional means.

2. A dead band device as in claim 1 wherein said biasing circuit further comprises a polarity reversal circuit having an input and an output, said means for receiving a bias potential connected to said input of said polarity reversal circuit, means connecting said output of said polarity reversal circuit to the second input terminal means of said second amplifier to produce a bias to said second amplifier of a first polarity.

3. A dead band device as in claim 1 wherein said first linear amplifier and said second linear amplifier are unity gain amplifiers.

4. A dead band device as in claim 1 wherein said means for receiving a bias potential includes means for adjusting a voltage applied thereto.

5. A dead band device as in claim 1 wherein said first polarity is negative, said second polarity is positive, and said first and said second polarity are of substantial equal magnitude.

6. A dead band device as in claim 1 wherein the output and input of said first linear amplifier are in phase with each other and the output and input of said second linear amplifier are in phase with each other.

7. A dead band device as in claim 1 Including a first resistance means connected in said first feedback loop between said first input terminal means and said second end of said first unidirectional means, and including a second resistance means connected in said second feedback loop between said second input terminal means and said second end of said second unidirectional means.

8. A dead band device as in claim 1 wherein said first unidirectional means and said second unidirectional means are diodes.

9. A dead band device as in claim 1 wherein said first output terminal means and said second output terminal means are connected together to form a circuit output for the dead band device.

* * * * *